United States Patent [19]

Callias

[11] Patent Number: 5,317,640
[45] Date of Patent: May 31, 1994

[54] SWITCHED AMPLIFIER

[75] Inventor: Francois Callias, Neuchatel, Switzerland

[73] Assignee: Ascom Audiosys AG, Flamatt, Switzerland

[21] Appl. No.: 785,093

[22] Filed: Oct. 30, 1991

[30] Foreign Application Priority Data

Oct. 30, 1990 [CH] Switzerland ............... 3446/90

[51] Int. Cl.⁵ .......................................... H04R 25/00
[52] U.S. Cl. ................................ 381/68.4; 381/68.2; 381/106; 330/251
[58] Field of Search ................... 381/68, 68.2, 68.4, 381/106; 330/10, 251, 207 A, 136, 10

[56] References Cited

U.S. PATENT DOCUMENTS

| | | | |
|---|---|---|---|
| 3,229,049 | 1/1966 | Goldberg | 381/68.2 |
| 4,390,849 | 6/1983 | Miskin | 330/251 |
| 4,592,087 | 5/1986 | Killion | 381/117 |
| 4,689,819 | 8/1987 | Killion | 381/68.6 |
| 4,829,270 | 5/1989 | Anderson et al. | 381/106 |

*Primary Examiner*—Curtis Kuntz
*Assistant Examiner*—Huyen D. Le
*Attorney, Agent, or Firm*—Nies, Kurz, Bergert & Tamburro

[57] ABSTRACT

In a hearing aid having a switched amplifier, an amplifier circuit is provided so that the pulse amplitude of the switched output signal is adjusted as a function of the envelope of the audio signal to be amplified. A controllable amplifier is switched in series ahead of the switched amplifier, whereby its control by the audio signal to be amplified proceeds in such a manner that the product of the amplifications of the two amplifiers remains constant for all audio signal levels.

1 Claim, 1 Drawing Sheet

SWITCHED AMPLIFIER

BACKGROUND OF THE INVENTION

1. Field of the Invention

The present invention relates to a hearing aid having a switched amplifier.

2. Description of the Prior Art

Switched amplifiers, known also as class D-amplifiers have been employed in hearing aids such as for instance disclosed in U.S. Pat. No. 4,592,087. The purpose of the amplifier is to output the microphone signal to the earphone with a sufficiently high power.

Important considerations in a hearing aid application are integrateability, i.e., the amplifier should lend itself to be designed as a so called integrated circuit, and low power consumption. A switched amplifier meets these demands better than an amplifier which operates with permanently controlled transistors (see "Modulated Pulse Audio Power Amplifiers for integrated circuits" by H. R. Camenzind, IEEE-Trans. Vol. AU-14, Nr. 3, September 1966).

Switched amplifiers also transmit an alternating current U to the earphone when no audio signal is fed from the microphone. In such a case the signal U is without any modulation and consists only of an alternating voltage component of which the frequency f is high enough that it is not emitted from the earphone as an accoustic signal. Despite that, a so called holding current flows in the earphone, which is undesired and may in practical cases make up to 50% of the total holding current consumption of the hearing aid. The holding current amounts to:

$$I = U/Z_f$$

In order to reduce I it is possible to increase the impedance $Z_f$ for the frequency f of the unmodulated output signal U by a low-pass filter, which is a common procedure for applications outside of the field of hearing aids but would occupy two much space in a hearing aid. A reduction of U does indeed reduce I, but limits the output power level which is attainable.

SUMMARY OF THE INVENTION

It is, therefore a general object of the invention to provide a hearing aid having a reduced holding current I in the earphone without the need of having to install a voluminuous filter and without limiting the output power level which may be attained.

A further object is to provide a hearing aid having a switched amplifier in which the circuit of the amplifier is designed in such a manner that the pulse amplitude of the switched output signal is adjusted as a function of the envelope curve of the audio signal to be amplified.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE PREFERRED EMBODIMENT

Figure 1:
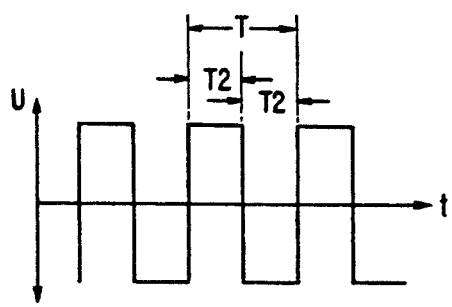
FIG. 1 illustrates the course of the output voltage supplied by the amplifier to the earphone of the hearing aid when no modulation is present.
Figure 2:
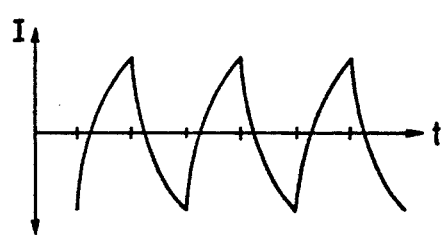
FIG. 2 illustrates the course of the holding current in the earphone at a certain reactive impedance of the earphone.
Figure 3:
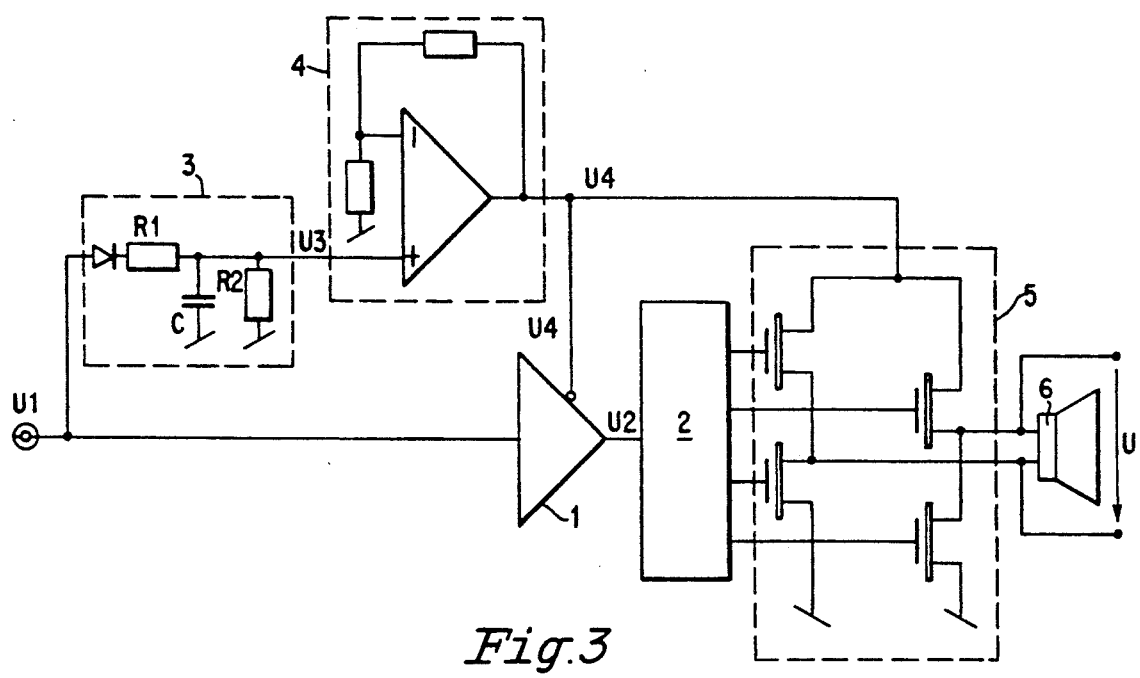
FIG. 3 illustrates an amplifier circuit in accordance with the invention.
Figure 4:
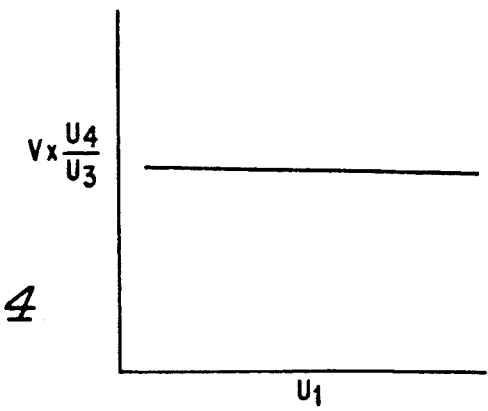
FIG. 4 illustrates the relationship of the product of amplifier gains as a function of the audio signal level.

As mentioned above, FIG. 1 illustrates the output voltage U which the amplifier supplies to the earphone when no modulation is present. Assuming a certain complex reactive impedance $Z_f$ of the earphone, the qualitative course of the holding current has a shape as shown in FIG. 2. The equation $f = 1/T > 2f_{TON}$ is applicable for all switched amplifiers, whereby $f_{TON}$ is the highest sound frequency which must be reproduced. In the not modulated case $T_1/T_2 = 1$. The instantaneous value of the audio signal component $U_{TON}$ in the output signal U is proportional to the pulse height U and to the keying ratio $T_1/T_2$. The holding current I itself is dependent from the pulse height only. The object, namely to reduce the holding current I is met in accordance with the invention in that U is reduced and the amount of the keying ratio $T_1/T_2$ is increased in the same measure. Because the maximal attainable audio signal output in the earphone decreases quadratically with U, this decrease of U must in any case be restricted from small or not present audio signals. The object of adjusting the decrease of U to the instantaneous audio signal level is achieved by a control circuit according to FIG. 3 as described hereinafter.

The audio signal $U_1$ supplied from the microphone is amplified in amplifier 1 in accordance with known procedures and supplied as $U_2$ to the modulator 2. The modulator 2 and the bridge circuit 5 are also designed such as in a common switched amplifier. The earphone 6 acts as load for the output voltage U.

In the inventive earphone amplifier, the supply $U_4$ of the bridge 5 is made variably. In case of a small or missing audio signal $U_1$, the supply $U_4$ and accordingly the pulse height of U are reduced. Therefore, the undesired holding current I through the earphone 6 decreases, too. The controlling of $U_4$ is made by means of the rectifier and filter 3 and through the amplifier 4. The rectified and filtered voltage $U_3$ is roughly proportional to the mean value of $U_1$. Time constants of $R_1C = 5$ ms and $R_2C = 100$ ms have proven themselves in the audio signal range. Due to the rectification and the filtering, $U_3$ and $U_4$ are roughly an image of the envelope of the audio signal $U_1$. $U_4$ will attain a maximal value for audio signals above a certain level; it is also possible to foresee a lower limit of $U_4$ for small levels of $U_1$.

Because of the audio signal component $U_{TON}$ of U is proportional to $U_4$, the amplification $U_{TON}/U_1$ would oscillate with the level of $U_1$. In order to maintain $U_{TON}/U_1$ constant, the above-described invention provides amplifier 1 as a voltage control amplifier. Its control voltage is $U_4$ and the selected characteristic of the voltage independent of the amplification $V = U_2/U_1$ amounts to $$V \approx 1/U_4$$

Quite obviously it is possible to achieve by means of a deviating characteristic a compression or expansion of $U_{TON}/U_1$, which may be desirable in hearing aid applications.

In the circuit in accordance with the present invention the controllable amplifier is in series with and ahead of the switched amplifier. The controllable amplifier is controlled by the audio signal to be amplified, so that the product of the amplifier gain of the switched amplifier and the amplifier gain of the controllable amplifier remains substantially constant for all levels of the audio signal to be amplified.

A further advantage of the inventive hearing aid amplifier follows from the fact that not only the holding current I is decreased upon a decreasing $U_1$, but also the noise voltage, which is undesiredly admixed to the working signal $U_2$ in the modulator 2. By means of such the dynamics of the modulator increase by the same factor by which $U_4$ is reduced from the maximal value to its minimal value (at a lower level of $U_1$).

While there is shown and described a present preferred embodiment of the invention, it is to be distinctly understood that the invention is not limited thereto, but may be otherwise variously embodied and practiced within the scope of the following claims.

What is claimed is:

1. A hearing aid comprising: an amplifier circuit including a switched amplifier providing a switched output signal, and circuit means for adjusting the pulse amplitude of the switched output signal as a function of the envelope curve of the audio signal to be amplified, in which the circuit means includes a controllable amplifier in series with and ahead of the switched amplifier and is controlled by the audio signal to be amplified so that the product of the amplifier gain of the switched amplifier and of the controllable amplifier remains substantially constant for all levels of the audio signal to be amplified.

* * * * *